United States Patent
Duppong

(10) Patent No.: US 8,729,398 B2
(45) Date of Patent: May 20, 2014

(54) ELECTRICAL ASSEMBLY WITH COMPLIANT PINS FOR HEAT DISSIPATION

(75) Inventor: Jeffrey S Duppong, Fargo, ND (US)

(73) Assignee: Deere & Company, Moline, IL (US)

( * ) Notice: Subject to any disclaimer, the term of this patent is extended or adjusted under 35 U.S.C. 154(b) by 126 days.

(21) Appl. No.: 13/432,582

(22) Filed: Mar. 28, 2012

(65) Prior Publication Data

US 2013/0256003 A1 Oct. 3, 2013

(51) Int. Cl.
*H05K 1/00* (2006.01)

(52) U.S. Cl.
USPC ............................ 174/252; 174/526; 174/267

(58) Field of Classification Search
USPC .................. 174/252, 267, 526; 361/381, 687, 361/720–722
See application file for complete search history.

(56) References Cited

U.S. PATENT DOCUMENTS

| | | | |
|---|---|---|---|
| 4,602,315 A | 7/1986 | Breese | |
| 4,783,721 A | 11/1988 | Yamamoto et al. | |
| 5,055,055 A | 10/1991 | Bakker | |
| 5,883,782 A * | 3/1999 | Thurston et al. | 361/704 |
| 6,184,504 B1 | 2/2001 | Cardella | |
| 6,894,220 B1 | 5/2005 | Kozak et al. | |
| 7,083,434 B1 | 8/2006 | Blossfeld | |
| 7,607,824 B2 | 10/2009 | Chandler et al. | |
| 7,983,046 B1 | 7/2011 | Borzabadi et al. | |
| 2007/0153479 A1 | 7/2007 | Hamman | |
| 2008/0166928 A1 | 7/2008 | Tang | |
| 2008/0220665 A1 | 9/2008 | Darr et al. | |
| 2009/0109624 A1 | 4/2009 | Chan et al. | |
| 2010/0091464 A1 | 4/2010 | Ohnishi et al. | |
| 2010/0207150 A1 | 8/2010 | Grajcar | |

OTHER PUBLICATIONS

Flared Aluminum Pin Fin Heat Sinks. Datasheet [online]. Cool Innovations [retrieved on Mar. 27, 2012]. Retrieved from the Internet: <URL: www.coolinnovations.com/includes/pdf/heatsinks/3-1010XXG.pdf>.
J-Tech compliant Pin Technology. Product Catalog Brochure [online]. Conesys [retrieved on Mar. 27, 2012]. Retrieved from the Internet: <URL: http://www.j-tech.com/product_catalog.html>.
Solderless Press-Fit Terminals for Automotive Applications. Datasheet [online]. Interplex Industries, Inc. [retrieved on Mar. 27, 2012]. Retrieved from the Internet: URL: http://www.interplex.com/press-fit-compliant-pin-technical-bulletins>.
BGA Heat Sink. Datasheet [online]. Cooliance [retrieved on Mar. 27, 2012]. Retrieved from the Internet: <URL: www.cooliance.com/pdfs/CMP051919.pdf>.
The International Search Report and the Written Opinion of the International Searching Authority, dated Apr. 23, 2013 (9 pages).

* cited by examiner

*Primary Examiner* — Jeremy C Norris

(57) ABSTRACT

An electrical assembly comprises a substrate having a dielectric layer and one or more electrically conductive traces overlying the dielectric layer. An electrical component is mounted on a first side of the substrate. The electrical component is capable of generating heat. A plurality of conductive through holes in the substrate are located around a perimeter of the electrical component. The conductive through holes are connected to a conductive trace for heat dissipation. A cooling cavity has bores that face a second side of the substrate opposite the first side. A plurality of respective compliant pins are inserted into corresponding conductive through holes and the bores, wherein a generally exposed portion of the compliant pin is exposed to air or a coolant liquid within the cooling cavity.

19 Claims, 3 Drawing Sheets

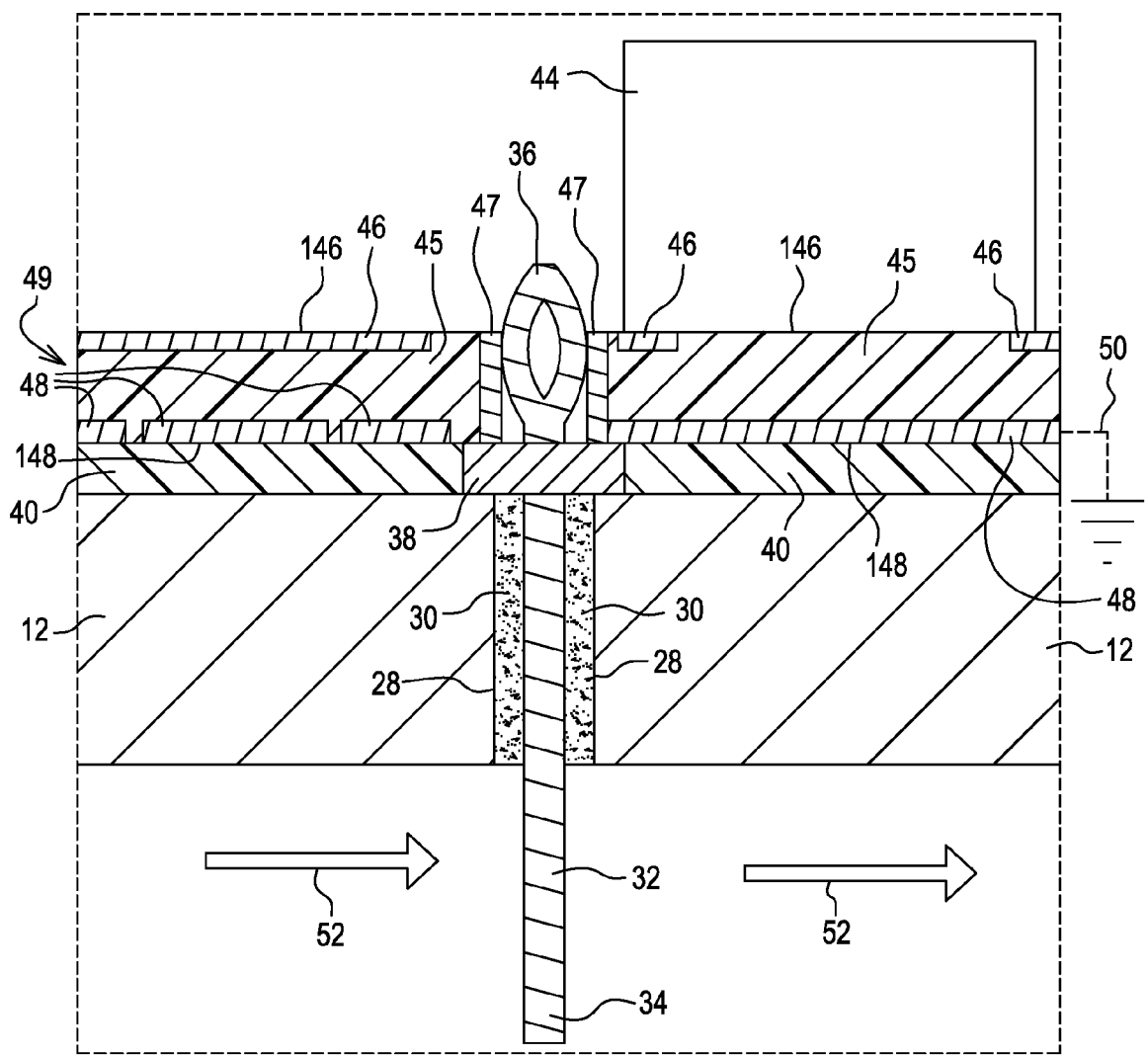

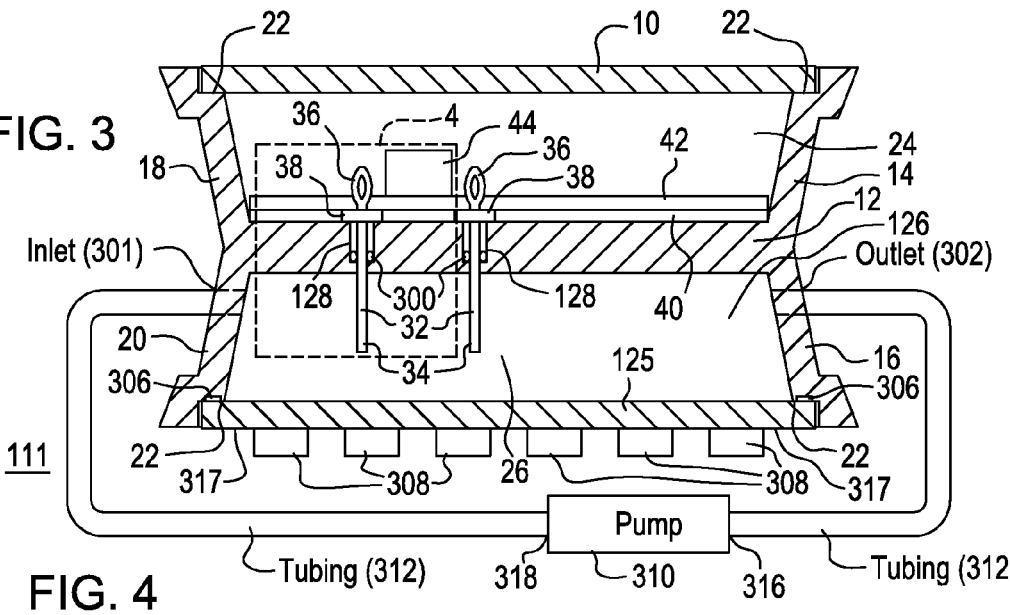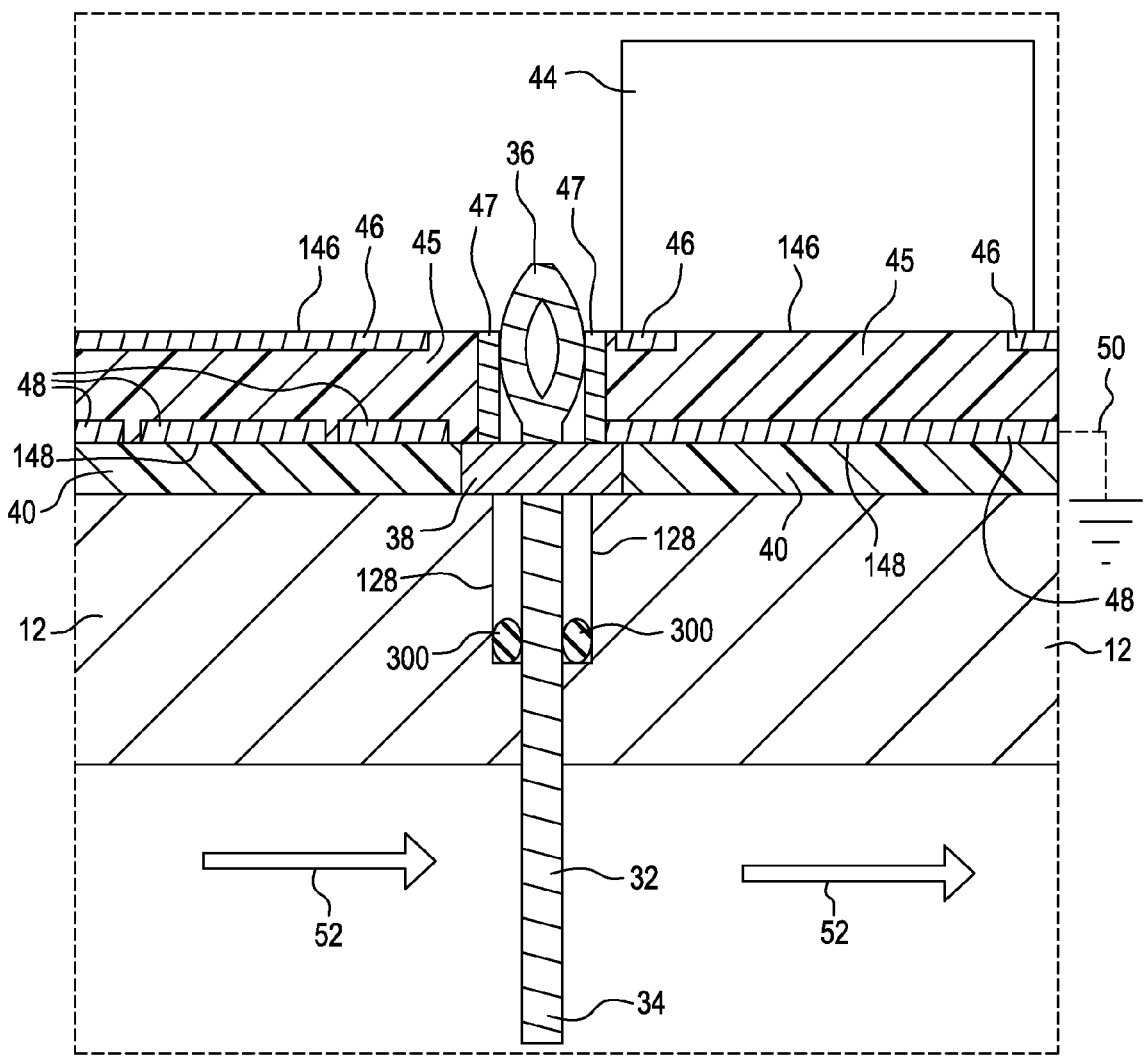

ELECTRICAL ASSEMBLY WITH COMPLIANT PINS FOR HEAT DISSIPATION

FIELD OF THE INVENTION

This invention relates to an electrical assembly with compliant pins for heat dissipation.

BACKGROUND

In certain prior art, compliant pins have been inserted into metal-plated, through holes in a circuit board to form electrical connections between a device and terminals on the circuit board. If an electrical device or component generates heat, its housing, package, or jacket may be configured to improve heat dissipation up to a point. Although an electrical device or component may be mounted on a dedicated metal heat sink with fins to further enhance heat dissipation, in some prior art the finned heat sink may add cost, weight and manufacturing complexity to the electrical assembly. Accordingly, there is need for an electrical assembly with compliant pins for heat dissipation to address the aforementioned deficiencies.

SUMMARY OF THE INVENTION

In accordance with one embodiment, an electrical assembly comprises a substrate having a dielectric layer and one or more electrically conductive traces overlying the dielectric layer. An electrical component is mounted on a first side of the substrate. The electrical component is capable of generating heat. A plurality of conductive through holes in the substrate are located around a perimeter of the electrical component. The conductive through holes may be connected to a conductive trace for heat dissipation. A cooling cavity has bores that face a second side of the substrate opposite the first side. A plurality of respective compliant pins are inserted into corresponding conductive through holes and the bores, wherein an exposed portion (e.g., generally cylindrical portion) of the compliant pin is exposed to air or a coolant liquid within the cooling cavity.

BRIEF DESCRIPTION OF THE DRAWINGS

FIG. 1 is a cross-sectional view of a first embodiment of an electrical assembly.

FIG. 2 is an enlarged view of the area in rectangular region 2 of FIG. 1.

FIG. 3 is a cross-sectional view of a second embodiment of an electrical assembly.

FIG. 4 is an enlarged view of the area in rectangular region 4 of FIG. 3.

DESCRIPTION OF THE PREFERRED EMBODIMENT

Figure 5:
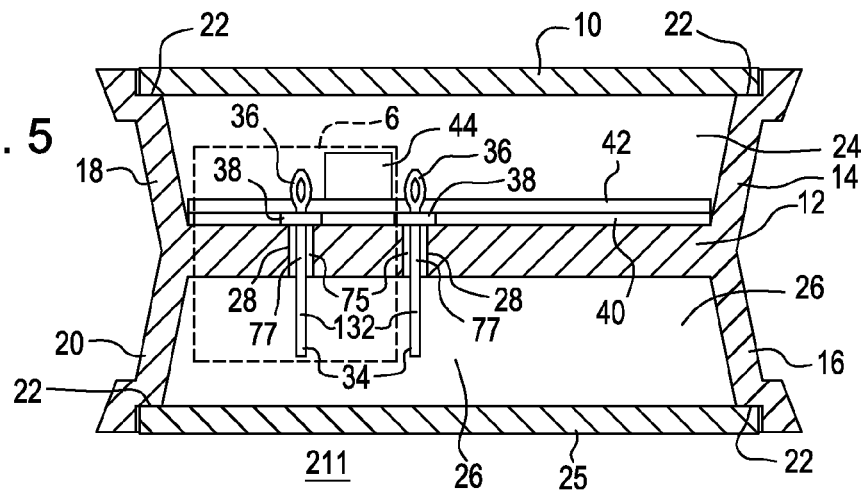
FIG. 5 is a cross-sectional view of a third embodiment of an electrical assembly.

FIG. 1 and FIG. 2, collectively, illustrate a first embodiment of an electrical assembly 11. The electrical assembly 11 may comprise an electrical circuit, an electronic circuit, an electrical device or an electronic device. In FIG. 1 and FIG. 2, the electrical assembly 11 comprises a substrate 49 having a dielectric layer 45 and one or more electrically conductive traces (46, 48) overlying the dielectric layer 45. An electrical component 44 (e.g., surface mount device or hole mounted device) is mounted on a first side 146 of the substrate 49. The electrical component 44 is capable of generating heat. A plurality of conductive through holes 47 (e.g., metal plated-through holes or via holes) in the substrate 49 are located: (1) around a perimeter of the electrical component 44, or (2) at other locations where any local clearance space is available in the substrate 49 between mounted electrical components 44, or (3) at uniform spacings around the substrate 49 to promote uniform heat dissipation, or (4) any other location where the design of the circuit traces and circuit board permits to promote heat dissipation over the entire surface area of the circuit board or localized heat dissipation over targeted areas (e.g., localized thermal dissipation zones) of the circuit board.

In one configuration, the conductive through holes 47 may be connected to a conductive trace (46, 48) for heat dissipation. A cooling cavity 26 has bores 28 that face a second side 148 of the substrate 49 opposite the first side 146. A plurality of respective compliant pins 32 are inserted into corresponding conductive through holes 47 and the bores 28, wherein an exposed portion (e.g., a generally cylindrical portion) of the compliant pin 32 is exposed to air or a coolant liquid within the cooling cavity 26. In FIG. 1 and FIG. 2, the exposed portion extends from below central common wall 12 to the lower section 34 of the compliant pin, for example.

In one embodiment, the substrate 49, dielectric layer 45, and the electrically conductive traces (46, 48) comprise a circuit board as the substrate 49. A supplemental dielectric layer 40 (e.g., potting compound or polymeric layer) may be positioned between the cooling cavity 26 and the second side 148 of the substrate 49. The supplemental dielectric layer 40 is sandwiched between the common central wall 12 of the cooling cavity 26 and the second side 148 of the substrate 49. The supplemental dielectric layer 40 may electrically insulate the conductive traces 48 of the substrate 49 or circuit board from a central common wall 12 or the cooling cavity 26 to prevent short circuits and ground faults that might otherwise occur.

In one configuration, the substrate 49 comprises a dielectric layer 45 or body, such as ceramic, polymer, plastic, a fiber-filled resin, fiberglass, a fiber-filled polymer, a fiber-filled plastic, or another dielectric material. The conductive traces (46, 48) may be positioned on a first side 146 of the substrate 49, on a second side 148 of the substrate 49 opposite the first side 146, or on both the first side 146 and the second side 148 of the substrate 49. Together, the dielectric layer 45 and the conductive traces (46, 48) form a substrate 49, such as a circuit board, a single-sided circuit board, a double-sided circuit board, a multilayer circuit board. In one embodiment, first conductive traces 46 overly a first side 146 of the dielectric layer 45 or substrate 49, whereas second conductive traces 48 overly a second side 148 of the dielectric layer 45 or substrate 49. The conductive traces (46, 48) are formed of metal or metallic layer, for example. In one configuration, the electrically and thermally conductive traces (46, 48) may be formed of copper, aluminum, or a nickel alloy. For a multi-layer circuit board, there are multiple alternating layers of dielectric material (e.g., a fiberglass-based material such as FR4 or a polyamide material) and conductive trace.

The conductive through holes 47 may comprise metal-plated vias or metal plated through holes 47 in the substrate 49 or circuit board. The conductive through holes 47 may be formed by electroless deposition, chemical vapor deposition, physical vapor deposition, ion plating, sputtering, or other plating techniques, for example. In certain configurations, the conductive through holes 47 are not electrically connected to any of the circuit traces (46, 48) on any of the layers of the circuit board, whereas in other configurations the conductive through holes 47 are electrically connected to one or more circuit traces as described in more detail herein. In the former configurations, the conductive through holes are electrically-isolated from the conductive circuit board traces (46, 48), while still transferring and dissipating some heat within the coolant cavity 26 from the component 44. In the latter configurations, each conductive through holes 47 may be electrically connected (and mechanically connected) to one or more conductive traces (46, 48). In turn, the conductive traces (46, 48) may be connected to a ground 50, a ground plane (or rectangular metallic layer) on the substrate 49, a grounded metal heat sink, or a metal floating heat sink (e.g., not at ground potential of ground 50). Accordingly, the conductive traces (46, 48) may provide further thermal dissipation of the heat from the component 44 (e.g., via thermal conduction or dissipation). In any configuration, the conductive through holes 47 extend through all layers of the substrate 49 or circuit board, where a multi-layer circuit board is used.

In one embodiment, the conductive through holes 47 may be spaced (e.g., at uniform or even spatial intervals) around the entire perimeter of the electrical component 44 to the extent the available space on the substrate 49 or circuit board permits. In another embodiment, the conductive through holes 47 may be spaced in a grid-like arrangement around the perimeter of the electrical component as available space on the substrate 49 or circuit board permits. In yet another embodiment, the conductive through holes 47 are spaced in the substrate 49 at a uniform spatial separation with respect to a component perimeter of the electrical component 44 (e.g., in a rectangular, circular, elliptical or other pattern that mimics the shape or cross-section of the component in the horizontal plane).

The electrical component 44 may comprise any of the following: a semiconductor, a power transistor, a relay, a solenoid, a tube, a diode, a microchip, a microprocessor, a programmable logic array, an application specific integrated circuit, an integrated circuit, a discrete electronic component, a resistor, a capacitor, an inductor, a transformer, or another electrical or electronic device. The electrical component 44 may comprise any type of heat generating component that radiates heat to the ambient environment and which might cause deleterious effects to the proper operation or full functionality of the electrical assembly 11, or to nearby or adjacent components (e.g., magnetic, electrical or electronic components).

As illustrated in FIG. 1, the electrical assembly 11 comprises a cooling cavity 26 and an electrical cavity 24. As shown, the electrical cavity 24 is bounded by one or more walls (e.g., side walls (14, 18), wall 12, and rear wall) and a first cover 10 to form an enclosed volume. In one embodiment, the cooling cavity 26 is bounded by one or more walls (e.g., side walls (16, 20), wall 12, and rear wall) and a second cover 25 to form an enclosed volume. In an alternative embodiment, the second cover 25 of the cooling cavity 26 may be omitted to expose the compliant pins 34 to the ambient environment for cooling and heat dissipation of thermal energy from the circuit board. In other configurations, the cover 25 may enclose the cooling cavity 26, while providing openings or ventilation ports that allow for air circulation. Although the cooling cavity 26 is illustrated as a lower cavity and the electrical cavity 24 is illustrated as an upper cavity, in other embodiments the position of the cooling cavity 26 and the electrical cavity 24 may be reversed.

The cooling cavity 26 and the electrical cavity 24 may share a central common wall 12 or partition that contains the bores 28 for receiving the compliant pins 32. The cooling cavity 26 and electrical cavity 24 have outer sidewalls (14, 16, 18, 20). The cooling cavity 26 and electrical cavity 24 (e.g., including its walls 14, 18) may be composed of a plastic, a polymer, a fiber-filled plastic, a fiber-filled polymer, a plastic composite, a polymer composite, a ceramic material, a metallic material, a metal, or an alloy. The metallic material, a metal, an alloy, or another thermally conductive material may be selected for the walls of the cavities (24, 26) to enhance heat dissipation from the electrical component 44 and other circuitry within the electrical cavity 24. Further, a metal cavity or metal enclosure may reduce electromagnetic interference (e.g., radio frequency interference or noise) to or from other electrical or electronic devices isolated electromagnetically within the electrical cavity 24.

An electrical cavity 24 encloses the electrical component 44 and the substrate 49. The electrical cavity 24 has a corresponding first cover 10 to enclose the electrical cavity 24 and the electrical component 44. The cooling cavity 26 has a corresponding second cover 25 to enclose the electrical cavity 24 and the electrical component 44. The first cover 10 and the second cover 25 may mate or engage a recess 22 in the outer sidewalls (14, 16, 18, 20), for example. The first cover 10 and the second cover 25 may be fastened to the electrical assembly or the outer sidewalls via fasteners, an adhesive, snap-fit connectors, screws, or another fastening mechanism.

The cooling cavity 26 or central common wall 12 has bores 28 facing a second side 148 of the substrate 49 opposite the first side 146 of the substrate 49. As shown, the bores 28 may have a larger bore diameter or bore cross-section that the compliant pin 32 diameter or compliant pin 32 cross-section with a clearance gap. An adhesive 30 (e.g., thermally conductive adhesive) may be deposited or injected into the clearance gap to form a seal, while conducting heat to the central common wall 12. Respective compliant pins 32 are inserted into corresponding conductive through holes 47 and the bores 28. An exposed portion (e.g., generally cylindrical portion) of the compliant pin 32 is exposed to air (e.g., forced air or circulated air) or a coolant liquid within the cooling cavity 26.

In one configuration, a thermally conductive adhesive 30 is placed in each bore 28 of the cooling cavity 26 to bond to the compliant pin 32 to enhance heat dissipation. The thermally conductive adhesive 30 may comprise a plastic, a resin, a polymer or a polymeric matrix with thermally conductive filler particles. The thermally conductive filler particular may comprise one or more of the following: metallic filler particles, metal particles, or other thermally conductive filler particles, where the thermally conductivity of the filler particles is greater than that of the polymeric matrix.

In an alternate embodiment, instead of using a thermally conductive adhesive 30, the compliant pins may be over-molded or die-cast into a plastic, polymer, dielectric or metallic housing, with or without a dielectric layer, potting layer or another sealant layer between the substrate 49 and the central common wall 12 to provide a moisture resistant seal.

In an alternative embodiment, the central common wall 12, the first cover 10 (e.g., upper cover), the second cover 25 (e.g., lower cover), may have fins or raised ribs to promote improved heat dissipation.

In one embodiment, the compliant pin 32 is composed of a metal, an alloy, or a metallic material. The head of the compliant pin 32 may have a top section 36 or generally elliptical cross section, as shown, that is compressible or deformable. The top section 36 may be compressed to form an electrical connection between the conductive through hole 47 or plated via the compliant pin 32. The compliant pin 32 has a shoulder 38 may comprise a transverse member that is perpendicular to the longitudinal axis of the main body (e.g., where the longitudinal axis extends in a vertical manner in the drawings) of the compliant pin 32. The shoulder 38 may extend transversely between top section 36 and a bottom section 34 of the pin. The shoulder 38 may form a stop for forming a rest position of the compliant pin 32 with respect to the substrate 49, the conductive through hole 47 or the circuit board. The compliant pins 32 form a localized heat sink to transfer thermal energy away from the electrical component 44 or heat producing electrical component 44, where the thermal energy can be transferred to air or fluid within the cooling cavity 26.

Compliant pins 32 can be press-fitted into conductive through holes 47 to form solder-free electrical connections to one or more conductive traces 48 (e.g., grounded traces) on the substrate 49. Here, the compliant pins 32 are used as part of a heat-sinking solution. Compliant pins 32 are pressed into conductive through holes 47 in a substrate 49 (e.g., a circuit board) near a heat-generating component 44, such as a capacitor. The compliant pins 32 can conduct heat generated by the component 44 down the length of their metal bodies from a first side 146 of the substrate 49 to the a second side 148 (opposite the first side), where the heat is dissipated into or by a liquid coolant, a gaseous phase coolant, a liquid phase coolant or circulated air in a coolant cavity 26 or another chamber.

A number of compliant pins 32 are pressed (e.g., press-fitted) into the conductive through holes 47 in the substrate 49 (e.g., circuit board), such that the top section 36 (e.g., head with an elliptical-cross section that resembles the eye of a needle) of the compliant pins 32 extends above the first side 146 of the substrate 49 near the heat-generating component 44. Meanwhile, the lower section 34 of the compliant pin 32 extends down through the wall 12 (or the wall 12 and dielectric layer 40) into coolant cavity 26. If heat is generated or radiated by the electrical component 44, the heat or thermal energy is conducted thermally into the top section 36 of the compliant pins 32 and down through their bodies via the lower section 34 into the coolant cavity 26, where coolant flow may help to dissipate heat or thermal energy from the electrical assembly 11 (and the component 44) to the ambient environment (e.g., air around the electrical assembly 11). Accordingly, the electrical assembly 11 may promote longevity of the electrical component 44 by reducing thermal stress on the component 44 through effective heat transfer via compliant pins 32 near or surrounding the component 44.

In an alternate configuration, a flush-mount compliant pin may replace compliant pin 32, such that the flush-mount compliant pin is below, at or does not extend appreciably above the first side 146 of the substrate 49.

As illustrated in FIG. 1, the supplemental dielectric layer 40 (e.g., layer of potting material) and adhesive 30 may be added to provide a hermetic, water resistant, aqueous solution resistant, liquid tight, or environmental seal around the compliant pins 32 to prevent leakage of coolant fluid or liquid in the coolant cavity 26 through the conductive through holes 47 in the substrate 49 and between the compliant pin 32 and the wall 12 or barrier. The supplemental dielectric layer 40 or potting compound may be required between the second side 148 bottom surface of the circuit board and the wall 12 or floor of the electrical cavity 24 to provide a complete environmental seal around the compliant pins 32 and the holes 28.

In one embodiment, a compliant pin 32 is created by stamping the pin shape out of a flat sheet of metal or an alloy. However, the compliant pin 32 may be formed by metal casting, pressing, forging, tempering, heat treating, or other manufacturing processes. There are many possible, suitable forms and shapes of compliant pins (e.g., 32), and the examples shown in these figures are not meant to be limiting to the scope of the claims or otherwise. It is possible that a shoulder 38 or other transverse portion may be formed into the pin 32 to resemble or form a cross, a cruciform or a lowercase letter "t") so that the shoulder 38 provides a stop that prevents the pin from falling through the hole 28.

The electrical assembly of FIG. 2 is an enlarged view of the rectangular region 2 of the electrical assembly 11 in FIG. 1. Like reference numbers indicate like elements in FIG. 1 and FIG. 2.

Further, FIG. 2 illustrates that the conductive through hole 47 is optionally connected to a ground 50 or ground plane (e.g., metal or metallic rectangular region that may cover the entire second side 148 of the substrate) for heat dissipation. Further, the ground 50 or ground plane dissipates or discharges electrostatic potential to the ground to avoid damage to nearby components or circuitry that might be sensitive to electrostatic energy. The optional nature of the connection to ground 50 is shown by the dashed lines. In an alternate embodiment, the conductive through hole 47 is floating and not electrically connected to the electrical component 44. In another embodiment, the conductive through hole 47 and the compliant pin 32 mounted in the conductive through hole are not energized or connected to the active terminals of the component 44. However, if the conductive through hole 47 is connected to ground 50 via a conductive trace 48, then a ground pin or ground terminal of the component 44 may be connected via the compliant pin 32 and conductive through hole to the conductive trace (e.g., 48).

The arrows 52 in FIG. 2 are representative of possible movement of the air or fluid around an exposed portion or lower portion of the compliant pin 32. In one configuration, the cooling fluid within the coolant cavity 26 may comprise a fluid containing one or more of the following: a flourocarbon compound, perfluorocarbon, perfluorohexane, perfluorotripentylamine, or Fluorinert® coolant. As of the filing date of this document, Fluorinert® is a trademark of the 3M COMPANY, with offices at 3M Center, St. Paul, Minn. 55144.

The second embodiment of the electrical assembly 111 of FIG. 3 and FIG. 4, collectively, are similar to the first embodiment of the electrical assembly of FIG. 1, except the electrical assembly 111 of FIG. 3 further comprises a sealed cooling cavity 126 and a pump 310. FIG. 4 is an enlarged view of the rectangular region of the electrical assembly 111 in FIG. 3. Like reference numbers in FIG. 1 through FIG. 4, inclusive, indicate like elements.

In FIG. 3, a seal or gasket may be associated with a perimeter of the cover for sealing the cooling cavity 26. Further, a bore seal 300 seals in the bores 128 to prevent the ingress of coolant from the cooling cavity 126 to the component 44, or the electrical cavity 24. For example, each bore seal 300 may comprise an O-ring composed of an elastomer, rubber, synthetic rubber or neoprene. A cover seal 306 for the second cover 125 seals the cooling cavity 26. As shown, the second cover 125 has fins or raised ridges 308 to increase the surface area of the cover 125 and to enhance heat transfer from the air or fluid within the cooling cavity 126. The seals (300, 306) hermetically seal the cooling cavity 126 or confine the coolant or cooling liquid to the cooling cavity 126.

In one configuration, the cooling fluid within or circulated within the coolant cavity 126 may comprise a fluid containing one or more of the following: a flourocarbon compound, perfluorocarbon, perfluorohexane, perfluorotripentylamine, or Fluorinert® coolant. As of the filing date of this document, Fluorinert® is a trademark of the 3M COMPANY, with offices at 3M Center, St. Paul, Minn. 55144.

A pump 310 has a pump intake 316 and pump output 318. The cooling cavity 126 comprises an inlet 301 and an outlet 302. The outlet 302 is coupled to the pump intake 316 of a pump 310 via tubing 312 and the inlet 301 is coupled to the pump output 318 of the pump 310 via the tubing 312. The pump 310 circulates the coolant to improve the thermal heat dissipation and heat transfer to the ambient environment by passive thermal radiation from the exterior surface 317 of the cooling cavity 126. In an alternative embodiment, a radiator or coiled tube may be connected to the tubing 312 between the pump 310 and the inlet 301 or between the pump 310 and outlet 302 to increase thermal heat transfer to the ambient environment. The compliant pins 32 form a localized heat sink to transfer thermal energy away from the electrical component 44 or heat producing electrical component 44, where the thermal energy can be transferred to air or fluid within the cooling cavity 126.

The electrical assembly 111 of FIG. 4 is an enlarged view of the rectangular region 4 of the electrical assembly in FIG. 3. Like reference numbers indicate like elements in FIG. 2, FIG. 3 and FIG. 4.

Figure 6:
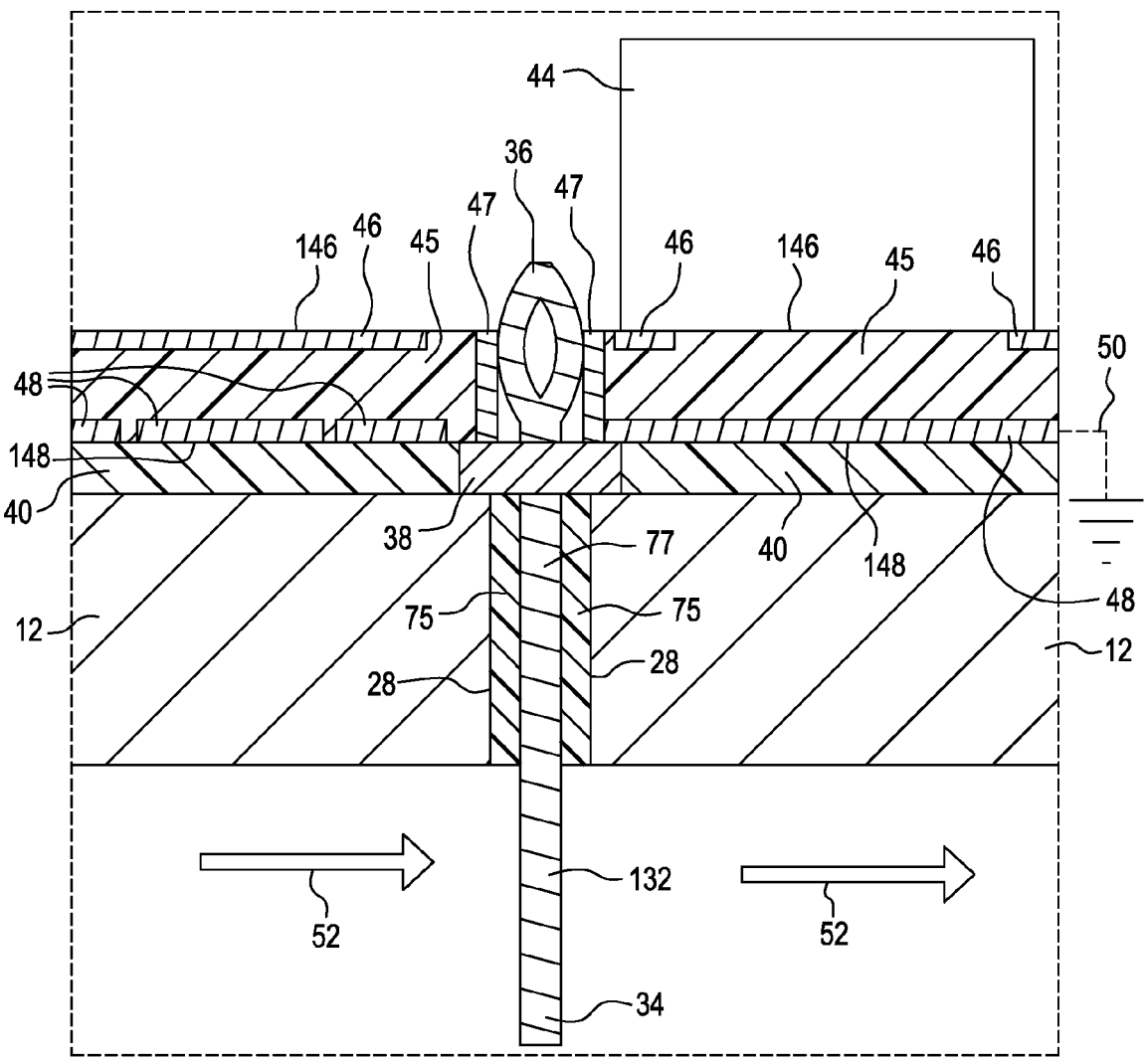
FIG. 6 is an enlarged view of the area in rectangular region 6 of FIG. 5.

The third embodiment of the electrical assembly 211 of FIG. 5 and FIG. 6, collectively, are similar to the first embodiment of the electrical assembly 11 of FIG. 1 and FIG. 2, except the electrical assembly 211 of FIG. 5 and FIG. 6 further comprises a compliant pin 132 with an outer sheath 75 (e.g., generally cylindrical outer sheath). Like reference numbers in FIG. 1, FIG. 2, FIG. 5, and FIG. 6 indicate like elements.

FIG. 5 illustrates that the compliant pin 132 has an outer sheath 75 (e.g., generally cylindrical outer sheath) covering at least part of the exposed portion (e.g., generally cylindrical portion 77). In FIG. 5 and FIG. 6, the exposed portion of the compliant pin 132 extends from below central common wall 12 to the lower section 34 of the compliant pin 132, whereas at least part of the exposed portion (e.g., generally cylindrical portion 77) is covered by the outer sheath 75, for example. Although compliant pin 132 may have a generally cylindrical portion 77 with a substantially circular cross section as illustrated in FIG. 5, in other configurations the compliant pin 132 may be polygonal or have a substantially rectangular cross section or substantially elliptical cross section. In one embodiment, the outer sheath 75 (e.g., generally cylindrical outer sheath) is composed of an elastomer or a generally resilient polymer.

The compliant pin 132 of FIG. 5 is inserted into the conductive through holes 47 and bores 28 and the outer sheath 75 may be compressed to form a seal between the bore 28 and the compliant pin 128 that blocks the egress of fluid within the cooling cavity 26. The compliant pins 132 form a localized heat sink to transfer thermal energy away from the electrical component 44 or heat producing electrical component 44, where the thermal energy can be transferred to air or fluid within the cooling cavity 26.

The electrical assembly 211 of FIG. 6 is an enlarged view of the rectangular region 6 of the electrical assembly in FIG. 5.

In an alternate embodiment of FIG. 5 and FIG. 6, the compliant pins 132 has an optional collar or an optional outer sheath 75 composed of a plastic, a polymer, a fiber filled plastic, a fiber filled polymer, a plastic composite or polymer composite. Here, the collar or outer sheath 75 would encircle or encapsulate at least an intermediate section above the lower section 34 of the pin 132. Further, the collar or the outer sheath 75 may provide: (1) structural support within the conductive through hole 28 for the pin compliant pin 132 to stand up straight or upright, and (2) a seal or plug between the exterior surface (e.g., outer cylindrical surface) of the compliant pin 132 and the opposing surface (e.g., inner cylindrical surface) of the conductive through hole 28 in the wall 12. The collar may be omitted in certain embodiments disclosed in this document.

One possible assembly method for this invention is embodied in the following steps:

In a first step, the electrical assembly (11, 111, 211) is created with holes 47 or bores 28 in the wall 12 between electrical cavity 24 and the coolant cavity (26 or 126), where the bores 28 align or register with similar corresponding conductive through holes 47 in the substrate 49 or circuit board.

In a second step, compliant pins (32 or 132) are inserted or placed into the conductive through holes 47 in the substrate 49, but not yet extending into the wall 12 between the electrical cavity 24 and the coolant cavity 26. Accordingly, the compliant pin heads or top sections 36 are above a first side 146 of the substrate 49 or circuit board.

In an alternate embodiment, the above second step is replaced within an alternate second step, where in a single procedure or step the compliant pins (32 or 132) are inserted through both the bores 28 and corresponding conductive through holes 47 that are aligned or registered with the bores 28. This alternate second step requires the substrate 49 or circuit board to be positioned within the electrical cavity 24 in preparation for insertion of the compliant pins (32 or 132).

In a third step, when compliant pins (32 or 132; e.g., via a pick-and-place machine) are mounted or placed in appropriate corresponding conductive through holes 47 in accordance with the design or plan, a thin layer of supplemental dielectric material 40 or resin in the liquid phase or prior to cross-linking is injected, pressure injected, placed or poured: (1) onto the wall 12 (between the electrical cavity 24 and the coolant cavity 26), where the substrate 49, component 44 and compliant pins 32 are not yet inside the electrical cavity 24, (2) into an air gap between the wall 12 of the electrical cavity 24 and the second side 148 of the substrate 49, where the substrate 49, component 44 and compliant pins 32 are inside the electrical cavity 24 and spaced above the wall 12 with a dielectric spacer, support or standoff.

In a fourth step, the fully populated substrate 49 or circuit board has the conductive through holes 47 and compliant pins 32 therein aligned with the bores 28 or holes 47 in the wall 12 and the substrate 49 is visually, mechanically, optically checked for alignment (of the substrate 49 and wall 12) or pressed downward against the uncured or uncross-linked dielectric layer 40. The conductive pins (32 or 132) may facilitate the registration or alignment of the circuit board with the bores 28 (or edges of the bores 28) in the wall 12 because the pins (32 or 132) tend to be self-centering so long as they are partially started or inserted into the bores 28. The supplemental dielectric layer 40 may have a vent or passageway that allows for the escape of excess volume of supplemental dielectric material 40 or uncured resin when downward force or pressure is applied against the first side 146 of the substrate 49 and toward the wall 12. After the compliant pins (32 or 132) are fully seated or inserted into the bores 28 and the conductive through holes 47, the supplemental dielectric material 40 or potting compound is allowed to cure or cross link, creating a seal around the pins (32 or 132). As previously explained the supplemental dielectric material 40 forms an electrically insulating barrier between conductive traces (46, 48) or components 44 on the first side 146 of the substrate 49 or circuit board. Here, the shoulder 38 or an intermediate section of the compliant pin (32 or 132) may be surrounded, encapsulated or embedded in the supplemental dielectric material 40 to form an integral seal that isolates the electrical cavity 24 from the coolant cavity 26.

In a fifth step, covers (10, 25, 125) or lids are placed on the electrical cavity 24 and coolant cavity 26. The covers may be sealed to the walls 12 or recess of the electrical assembly by a gasket, seal (306) or dispensed material.

Thus, any embodiments of the electrical assemblies (11, 111, 211) disclosed herein are well-suited for enhancing the heat dissipation generated by an electrical component (e.g., 44) or electrical circuitry via one or more compliant pins (e.g., 32, 132) that extend into a cooling cavity (e.g., 26). Further, the cooling cavity may be filled with a coolant, pumped coolant, or re-circulated coolant to facilitate heat transfer.

The electrical assembly facilitates inexpensive and pragmatic cooling of components (e.g., 44) on a circuit board (e.g., 49) with compliant pins, such as commercially available compliant pins. The electrical assembly (e.g., 11, 111, 211) is well suited for avoiding thermal damage and degradation to components of the electrical assembly.

Having described the preferred embodiment, it will become apparent that various modifications can be made without departing from the scope of the invention as defined in the accompanying claims.

The following is claimed:
1. An electrical assembly comprising:
    a substrate having a dielectric layer and one or more electrically conductive traces overlying the dielectric layer;
    an electrical component mounted on a first side of the substrate, the electrical component capable of generating heat;
    a plurality of conductive through holes in the substrate and around a perimeter of the electrical component, the conductive through holes connected to a conductive trace for heat dissipation;
    a cooling cavity with bores facing a second side of the substrate opposite the first side;
    a plurality of respective compliant pins inserted into corresponding conductive through holes and the bores, wherein an exposed portion of the compliant pin is exposed to air or a coolant liquid within the cooling cavity; and
    a dielectric layer between the cooling cavity and the second side of the substrate.
2. The electrical assembly according to claim 1 wherein the substrate and the electrically conductive traces comprise a circuit board.
3. The electrical assembly according to claim 1 further comprising:
    a thermally conductive adhesive in the bores of the cooling cavity to bond to the compliant pin to enhance heat dissipation.
4. The electrical assembly according to claim 1 further comprising:
    a bore seal in the bores to prevent the ingress of coolant from the cooling cavity to the component;
    a seal for a cover for sealing the cooling cavity.
5. The electrical assembly according to claim 4 further comprising:
    a pump having a pump intake and pump output; wherein the cooling cavity comprises an inlet and an outlet, the outlet coupled to the pump intake of a pump and the inlet coupled to the pump output of the pump.
6. The electrical assembly according to claim 1 wherein the conductive through hole is connected to a ground for heat dissipation.
7. The electrical assembly according to claim 1 wherein the conductive through hole is floating and not electrically connected to the electrical component.
8. The electrical assembly according to claim 1 wherein the compliant pin has a generally cylindrical outer sheath covering at least part of the generally exposed portion, the generally cylindrical outer sheath composed of an elastomer or a generally resilient polymer.
9. An electrical assembly comprising:
    a substrate having a dielectric layer and one or more electrically conductive traces overlying the dielectric layer;
    an electrical component mounted on a first side of the substrate, the electrical component capable of generating heat;
    a plurality of conductive through holes in the substrate and around a perimeter of the electrical component, the conductive through holes connected to a conductive trace for heat dissipation;
    a cooling cavity with bores facing a second side of the substrate opposite the first side;
    a plurality of respective compliant pins inserted into corresponding conductive through holes and the bores, wherein a generally exposed portion of the compliant pin is exposed to air or a coolant liquid within the cooling cavity; and
    an electrical cavity for enclosing the electrical component and the substrate.
10. The electrical assembly according to claim 9 wherein the cooling cavity and the electrical cavity have a common central wall, the bores residing within the common central wall.
11. The electrical assembly according to claim 10 wherein the electrical cavity has an electrical cover for enclosing the substrate and the component in the electrical cavity.
12. The electrical assembly according to claim 10 further comprising:
    a dielectric layer between the common central wall of the cooling cavity and the second side of the substrate.
13. The electrical assembly according to claim 9 further comprising:
    a thermally conductive adhesive in the bores of the common central wall to bond to the compliant pin to enhance heat dissipation.
14. The electrical assembly according to claim 9 further comprising:
    a bore seal in the bores to prevent the ingress of coolant from the cooling cavity to the electrical cavity;
    a seal for a cover for sealing the cooling cavity.
15. The electrical assembly according to claim 9 further comprising:
    a pump having a pump intake and pump output; wherein the cooling cavity comprises an inlet and an outlet, the outlet coupled to the pump intake of a pump and the inlet coupled to the pump output of the pump.
16. The electrical assembly according to claim 9 wherein the conductive through hole is connected to a ground for heat dissipation.
17. The electrical assembly according to claim 9 wherein the conductive through hole is floating and not electrically connected to the electrical component.
18. The electrical assembly according to claim 9 wherein the compliant pin has an outer sheath covering at least part of the generally exposed portion, the outer sheath composed of an elastomer or a generally resilient polymer.
19. An electrical assembly comprising:
    a substrate having a dielectric layer and one or more electrically conductive traces overlying the dielectric layer;
    an electrical component mounted on a first side of the substrate, the electrical component capable of generating heat;

a plurality of conductive through holes in the substrate and around a perimeter of the electrical component, the conductive through holes connected to a conductive trace for heat dissipation;
a cooling cavity with bores facing a second side of the substrate opposite the first side;
a plurality of respective compliant pins inserted into corresponding conductive through holes and the bores, wherein an exposed portion of the compliant pin is exposed to air or a coolant liquid within the cooling cavity and wherein at least one of the conductive through holes is connected to a ground for heat dissipation.

\* \* \* \* \*